US009013040B1

United States Patent
Schmidt

(10) Patent No.: US 9,013,040 B1
(45) Date of Patent: Apr. 21, 2015

(54) MEMORY DEVICE WITH DIE STACKING AND HEAT DISSIPATION

(71) Applicant: Jon Schmidt, San Juan Capistrano, CA (US)

(72) Inventor: Jon Schmidt, San Juan Capistrano, CA (US)

(73) Assignee: Sanmina Corporation, San Jose, CA (US)

( * ) Notice: Subject to any disclaimer, the term of this patent is extended or adjusted under 35 U.S.C. 154(b) by 0 days.

(21) Appl. No.: 14/045,226

(22) Filed: Oct. 3, 2013

Related U.S. Application Data

(63) Continuation of application No. 12/758,778, filed on Apr. 12, 2010, now abandoned.

(60) Provisional application No. 61/168,499, filed on Apr. 10, 2009.

(51) Int. Cl.

| | |
|---|---|
| *H01L 21/60* | (2006.01) |
| *H01L 23/498* | (2006.01) |
| *H01L 21/768* | (2006.01) |
| *H01L 25/18* | (2006.01) |
| *H01L 23/34* | (2006.01) |
| *H01L 23/00* | (2006.01) |

(52) U.S. Cl.
CPC ............... *H01L 25/18* (2013.01); *H01L 23/34* (2013.01); *H01L 24/17* (2013.01)

(58) Field of Classification Search
CPC ....... H05K 3/00; H01L 23/66; H01L 23/5226
USPC .......... 257/686, 685, 723, 712, 713, 717, 720, 257/773, 774, 737, 738, 778; 438/614
See application file for complete search history.

(56) References Cited

U.S. PATENT DOCUMENTS

| | | | | |
|---|---|---|---|---|
| 5,856,937 | A * | 1/1999 | Chu et al. ...................... | 365/51 |
| 7,345,892 | B2 * | 3/2008 | Imazato et al. .............. | 361/818 |
| 7,870,459 | B2 * | 1/2011 | Hazelzet ....................... | 714/753 |
| 8,559,181 | B2 * | 10/2013 | Clayton et al. ............... | 361/749 |
| 2005/0056923 | A1 * | 3/2005 | Moshayedi .................. | 257/686 |
| 2005/0146008 | A1 * | 7/2005 | Miyamoto et al. ........... | 257/686 |
| 2006/0249829 | A1 * | 11/2006 | Katagiri et al. .............. | 257/686 |
| 2007/0195505 | A1 * | 8/2007 | Savignac et al. ............. | 361/719 |
| 2008/0030966 | A1 * | 2/2008 | Goodwin ...................... | 361/749 |
| 2008/0087456 | A1 * | 4/2008 | Schuette ...................... | 174/252 |
| 2008/0237846 | A1 * | 10/2008 | Terui et al. .................... | 257/717 |
| 2009/0179318 | A1 * | 7/2009 | Chen ............................. | 257/686 |

(Continued)

FOREIGN PATENT DOCUMENTS

JP      8-282167 A   *   10/1996

*Primary Examiner* — Alexander Oscar Williams
(74) *Attorney, Agent, or Firm* — Loza & Loza, LLP; Julio M. Loza

(57) ABSTRACT

A memory device with die stacking is provided. A plurality of substrates layers are stacked together into a stack. Each substrate layer may include a substrate having a plurality of cavities to receive integrated circuit components within the thickness of the substrate. A plurality of conductive spheres are arranged between at least two adjacent substrate layers and are electrically coupled to the integrated circuit components in at least one of the two adjacent substrates. The two adjacent substrate layers of the stack include: (a) a first substrate having a first plurality of cavities to receive integrated circuit components, and (b) a second substrate having a second plurality of cavities to receive integrated circuit components, wherein the first plurality of cavities is offset from a second plurality of cavities.

14 Claims, 12 Drawing Sheets

(56) References Cited

U.S. PATENT DOCUMENTS

| | | | |
|---|---|---|---|
| 2010/0019368 A1* | 1/2010 | Shin ............................ | 257/686 |
| 2010/0062567 A1* | 3/2010 | Palaniappan et al. ......... | 438/107 |
| 2010/0257550 A1* | 10/2010 | Slothouber et al. ............. | 725/32 |
| 2011/0074028 A1* | 3/2011 | Pendse ......................... | 257/737 |
| 2011/0127671 A1* | 6/2011 | Yoshikawa et al. ........... | 257/738 |
| 2011/0171779 A1* | 7/2011 | Terui et al. ..................... | 438/108 |
| 2012/0133427 A1* | 5/2012 | Kim et al. ...................... | 327/564 |
| 2014/0151875 A1* | 6/2014 | Zhang et al. .................. | 257/737 |

\* cited by examiner

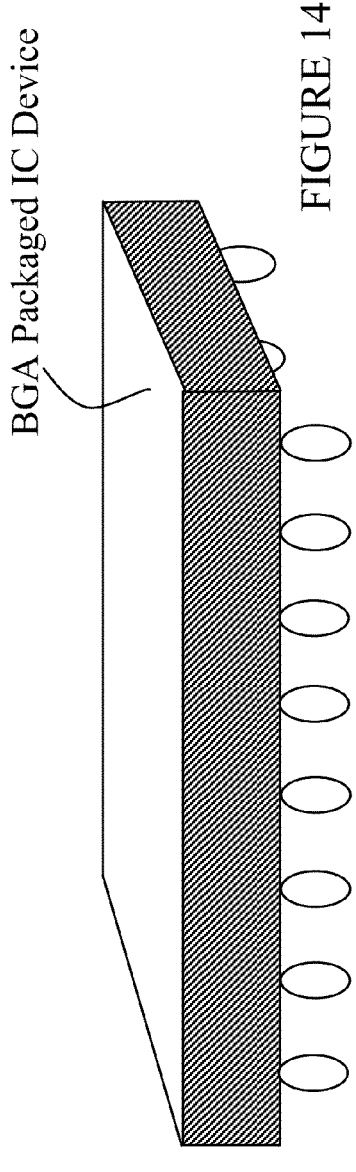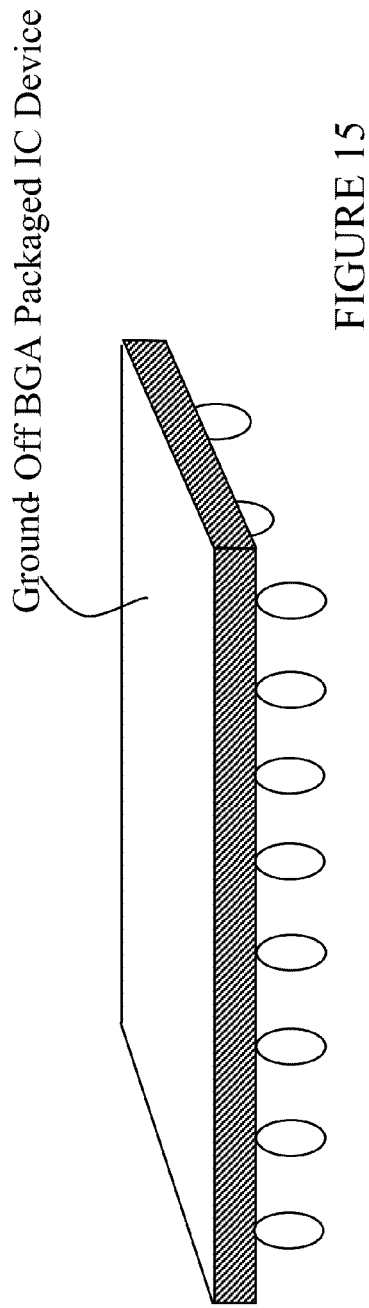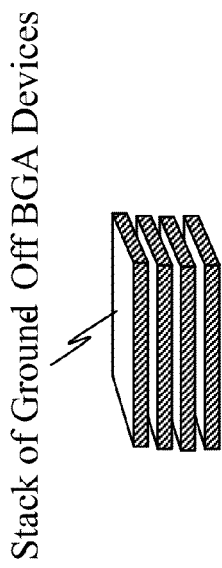
FIGURE 14
FIGURE 15
BGA Packaged IC Device
Ground Off BGA Packaged IC Device
Stack of Ground Off BGA Devices (Top View)

MEMORY DEVICE WITH DIE STACKING AND HEAT DISSIPATION

CLAIM OF PRIORITY UNDER 35 U.S.C. §119

The present Application for Patent is a continuation of, and claims priority to, U.S. application Ser. No. 12/758,778, filed Apr. 12, 2010, and claims priority to U.S. Provisional Application No. 61/168,499 entitled "Improvements to Memory Technologies" filed Apr. 10, 2009, each of which are assigned to the assignee hereof and hereby expressly incorporated by reference herein.

FIELD

Various features relate to semi-conductor devices and manufacturing and memory devices.

BACKGROUND

In the field of integrated circuits, memory devices, and memory modules, there is often a need to manufacture devices ever more economically and/or improve densities of such devices. Therefore, various features described herein relate to achieving such improvements.

BRIEF DESCRIPTION OF THE DRAWINGS

Various features, nature, and advantages may become apparent from the detailed description set forth below when taken in conjunction with the drawings in which like reference characters identify correspondingly throughout.

FIGS. 14 and 15 illustrate how improved IC densities may be achieved by thinning the IC.

DETAILED DESCRIPTION OF THE INVENTION

In the following detailed description of the invention, numerous specific details are set forth in order to provide a thorough understanding of the invention. However, the invention may be practiced without these specific details. In other instances, well known methods, procedures, and/or components have not been described in detail so as not to unnecessarily obscure aspects of the invention.

Concept A—Flip IC Chips on Stacking Substrates

Figures 1, 2:
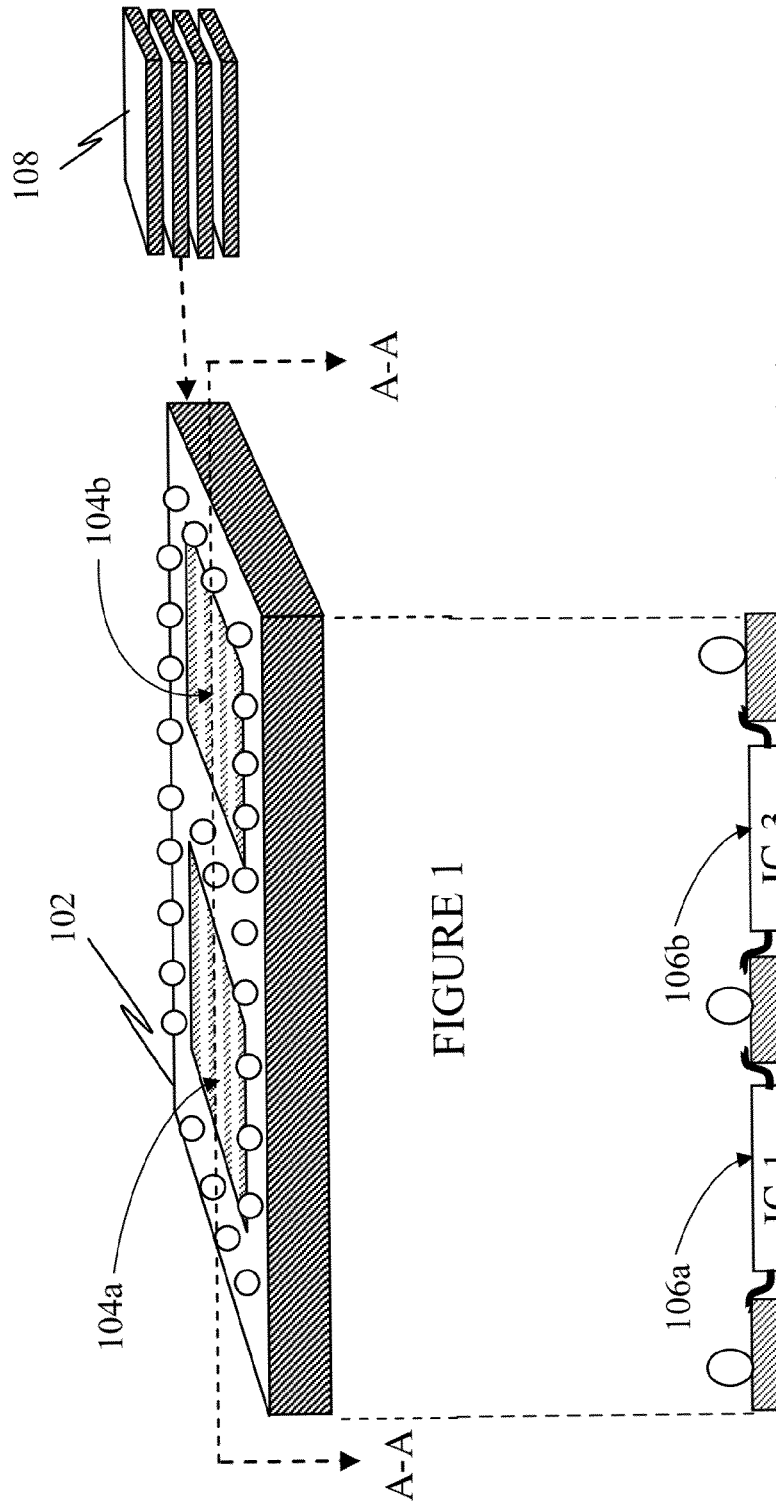
FIGS. 1 and 2 illustrate a substrate 102 that includes a plurality of cavities to receive packaged IC chips within the thickness of the substrate.

FIGS. 1 and 2 illustrate a substrate 102 that includes a plurality of cavities 104a and 104b to receive packaged IC chips 106a, 106b, 106c, 106d within the thickness of the substrate 102. In one example, the thickness of the substrate 102 may be 40 to 100 mils while the thickness of each IC chip 106 may be 20 to 50 mils Standard IC chips 106 are mounted within the cavities 104 in an inverted orientation. The connection leads or legs for the packaged ICs are typically bent for surface mounting applications. These same leads or legs are coupled to the surface of the substrate 102 but in an (unintended) inverted position. Consequently, a high density and thin substrate is achieved by placing the packaged ICs 106 in an inverted orientation within the cavities 104, thereby making each layer in a stack 108 of substrates thinner than otherwise possible. In this example, the substrates 102 of the stack 108 may be interconnected by BGAs between the substrate layers. Such stack 108 can be achieved without the use of interposers to space the substrate layers apart. The substrates 102 may be sized so that two ICs can fit in the thickness of each cavity 104, thereby increasing the IC density of the stack 108. In one example, the ICs 106 may include memory devices such that the stack 108 may be a high-density memory stack. A plurality of stacks 108 may be mounted on one or two sides of a memory module.

Figure 3:
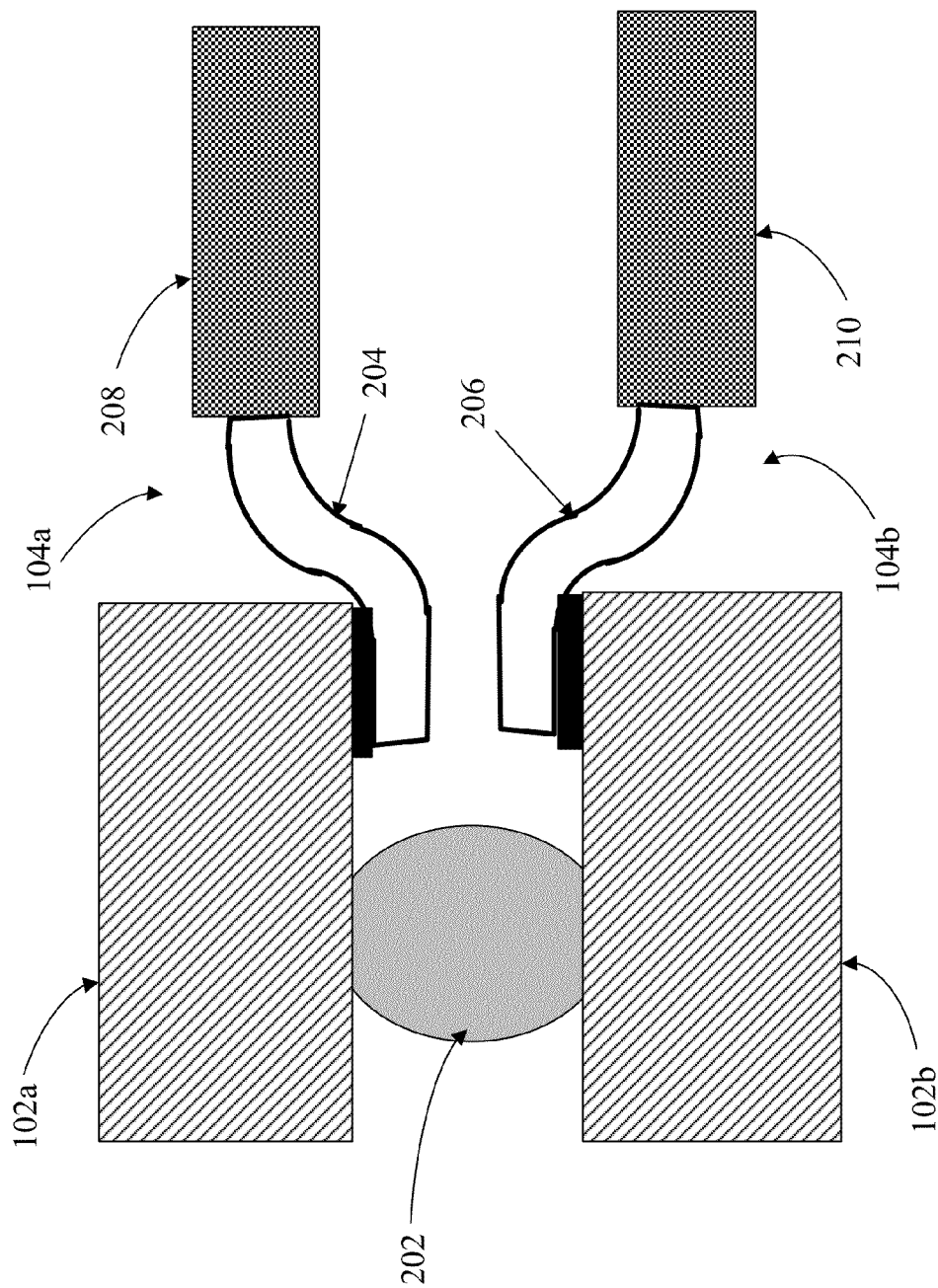
FIGS. 3 and 4 illustrate various examples of how adjacent substrates and ICs may be arranged.
Figure 4:
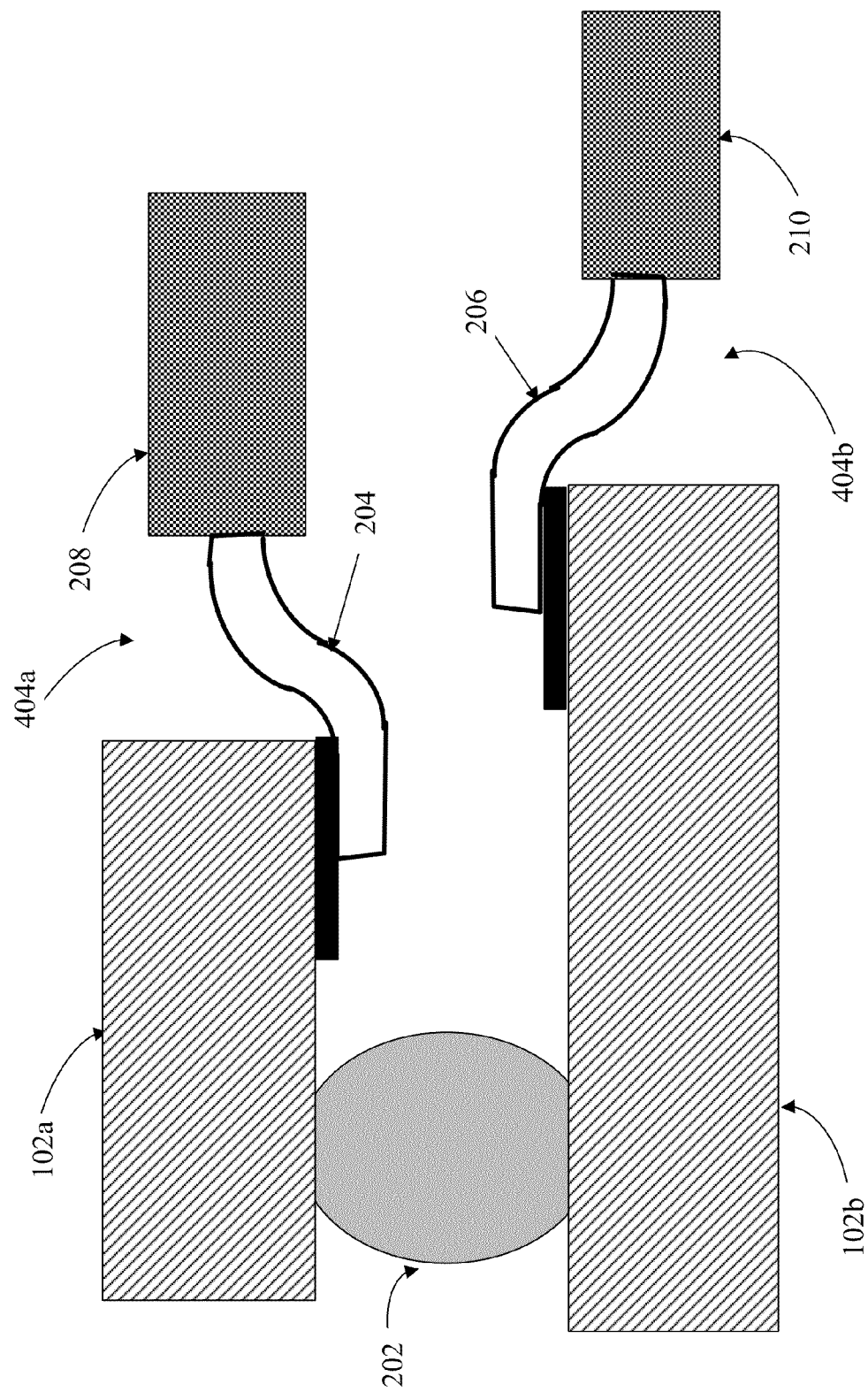

FIGS. 3 and 4 illustrate various examples of how adjacent substrates and ICs may be arranged. One concern with closely spaced substrate layers (as in stack 108) it the possibility of electrical shorts. FIG. 3 illustrates two adjacent substrates 102a and 102b separated by a BGA sphere 202. In this example, the cavities 104a and 104b in the adjacent substrates 102a and 102b line up with each other. This causes the leads 204 and 206 for the ICs 208 and 210 to be in close proximity (e.g., as little as 0.008"-0.011" in separation). Such close proximity may cause shorts between these leads 204 and 206.

FIG. 4 illustrates how the two adjacent substrates 102a and 102b may have offset cavities 404a and 404b. Because the cavities 404a and 404b are now offset from each other (i.e., their edges are slightly offset from each other—e.g., 0.040" offset), it increases the space between the leads 204 and 206, making it less likely that an electrical short will occur. Note that one advantage of mounting the ICs 208 and 210 in an inverted/flipped orientation (relative to the convention orientation) is that the legs 204 and 206 have less of a tendency to separate from the pads on the substrate and cause electrical failure due to thermal cycling. That is, when the ICs are mounted in the conventional manner (with the IC above the substrate), the legs 204 and 206 may have a tendency to lift due to thermal cycling and break their electrical bond with the pad on the substrate. By mounting the ICs 208 and 210 within the cavity so that the legs 204 and 206 are inverted/flipped, the lifting problem is alleviated as the legs 204 and 206 are less likely to break their bond due to thermal cycling.

Concept B—Integrating Components into a BGA Stack

Figure 5:
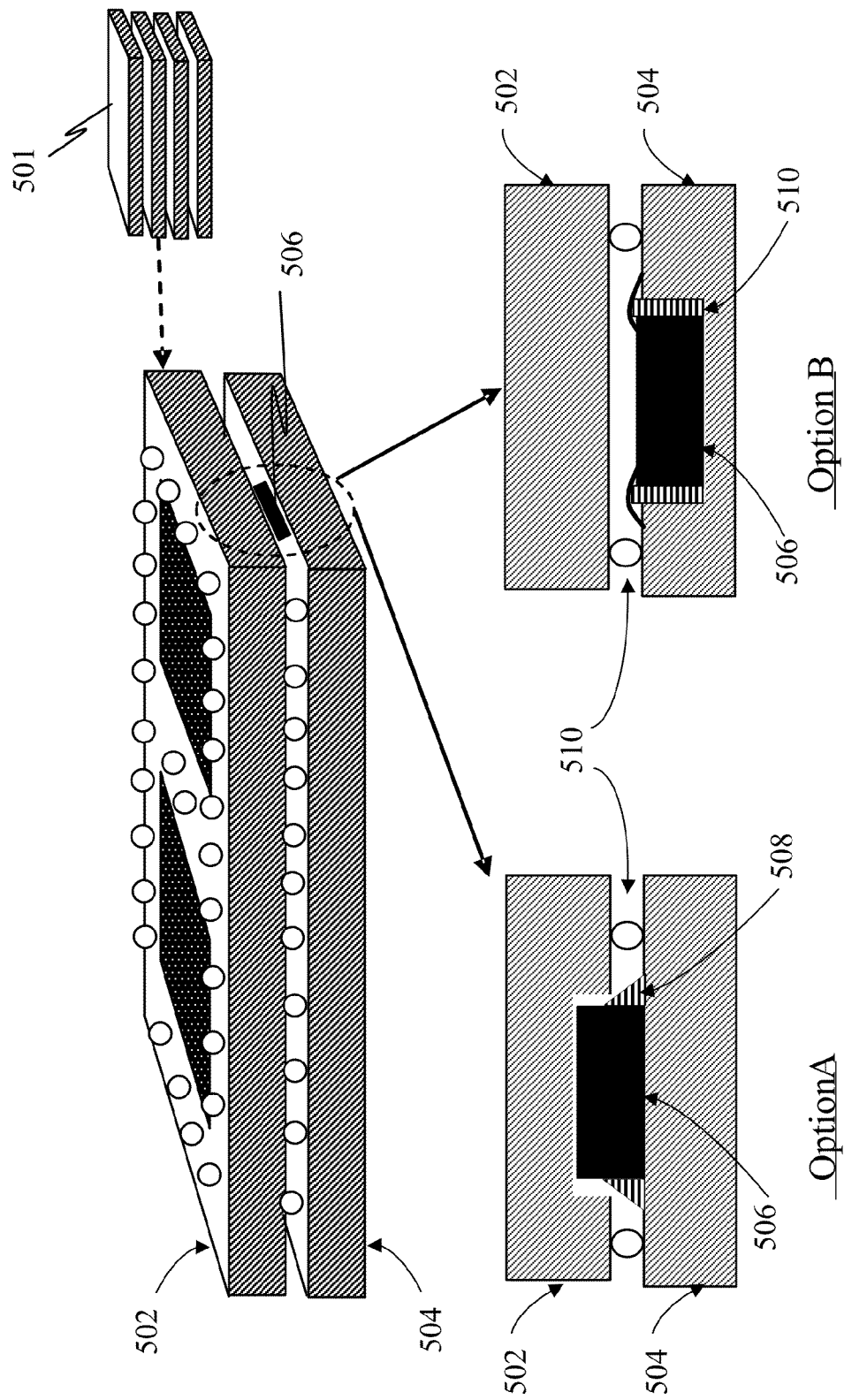
FIG. 5 illustrates how electronic components may be integrated into a stacked substrate by creating cavities in the substrates.

FIG. 5 illustrates how electronic components 506 may be integrated into a stacked substrate 501 by creating cavities in the substrates 502 or 504. Note that the substrates 502 and 504 may be the same as those substrates illustrated in FIGS. 1-4. The substrates 502 and 504 are stacked using BGAs, but the electronic components 506 may be thicker than the space provided by the BGAs. Consequently, electronic components 506 can be integrated between layers of a BGA stack 501 by including cavities that will accept the thickness of the electronic components 506. In one example, the electronic components 506 may be capacitors and resistors. In a first Option A, the electronic component 506 is mounted on the surface of a first substrate 504 and a cavity is formed on the opposite second substrate 502 that receives the electronic component 506. In this example, the electronic component may use solder 508 to couple to electrical traces on the first substrate 504. In a second Option B, a cavity is formed on the first substrate 504 and the electronic component 506 is inserted therein and electrically coupled to electrical traces on the surface of the first substrate 504. In this example, the electronic component 506 may first be glued to the bottom of the cavity. Solder 510 may then be applied to at least two sides of the electronic component 510 to electrically couple it to traces on the surface of the first substrate 504. With either of these methods, electronic components may be accommodated between layers of a stack 501 without increasing the thickness of the stack 501 or the spacing between substrate layers. That is, even thought the BGAs between the substrate layers may be smaller than the height of the electronic components 506, forming a receiving cavity (either on the receiving substrate or opposite substrate) allows incorporating such electronic components within the stack. In one example, the spheres utilized in the BGA may be 22 mils in diameter.

Figure 6:
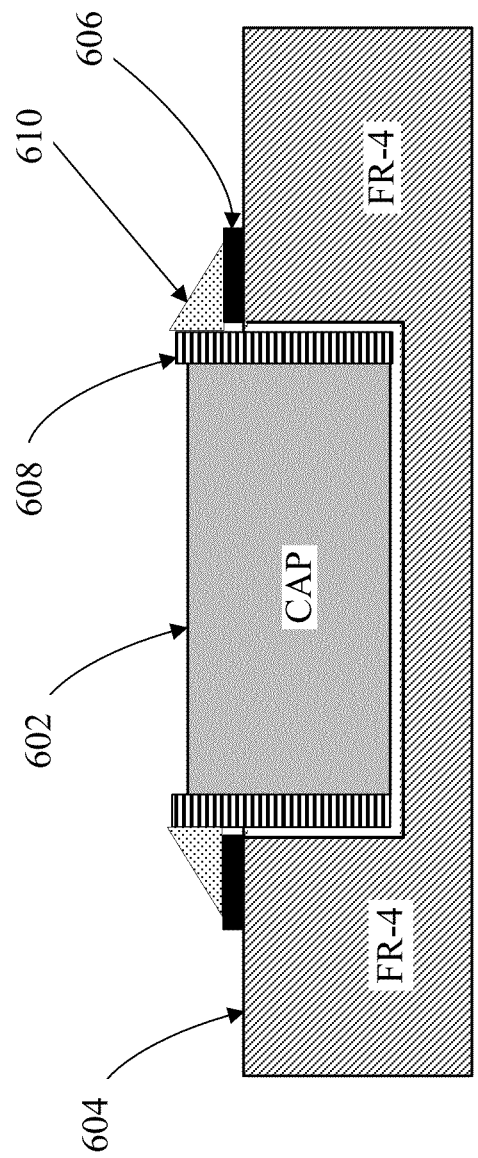
FIG. 6 illustrates one example based on FIG. 5 of how a passive component may be received within a cavity of a substrate.

FIG. 6 illustrates one example based on FIG. 5 of how a passive component (e.g., a capacitor) 602 may be received within a cavity of a substrate 604. In this example, it can be appreciated how an electrical pad 606 on the substrate 604 may be coupled to an electrically conductive region 608 of the component 602 using solder 610. In this example, the component 602 sits slightly above the surface of the substrate 604 such that the solder 610 can more easily couple the electrically conductive region 608 to the pad 606.

Figure 7:
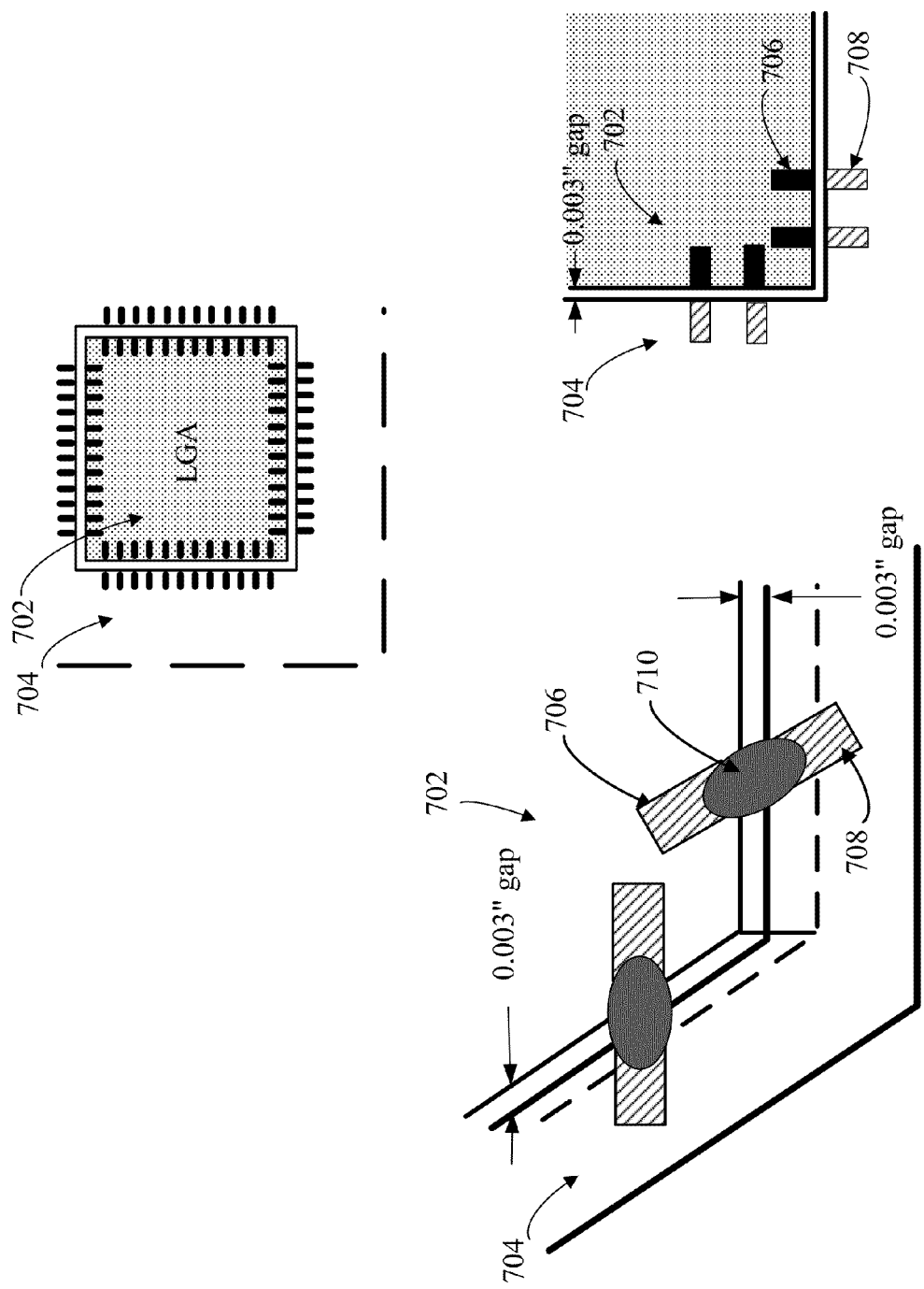
FIG. 7 illustrates one example based on FIG. 5 of how a surface-mounted packaging component may be received within a cavity of a substrate.

FIG. 7 illustrates one example based on FIG. 5 of how a surface-mounted packaging component 702 may be received within a cavity of a substrate 704. A land grid array (LGA) is a type of surface-mount packaging used for integrated circuits. Typically, such surface-mounted components would have the electrical pads 706 face down toward the surface on which the component is mounted. However, in this implementation the component 702 sits within a cavity in the substrate 704. The substrate 704 has corresponding pads 708 along the perimeter of the cavity such that solder 710 may be used to electrically couple the pads of the component 702 to the pads 708 on the substrate 704 across a gap.

Concept C—Direct Mounting of IC Dies Using Stud Bumping

Figure 8:
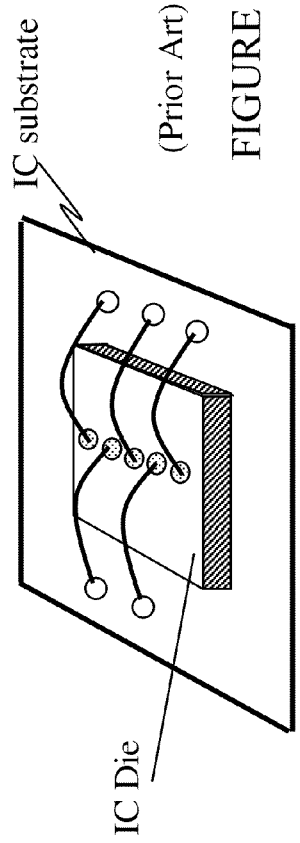
FIG. 8 illustrates how prior art IC dies are typically mounted on a packing substrate using wire bonds.

FIG. 8 illustrates how prior art IC dies are typically mounted on a packing substrate using wire bonds. However, it would be advantageous to mount an IC directly on a substrate.

Figure 9:
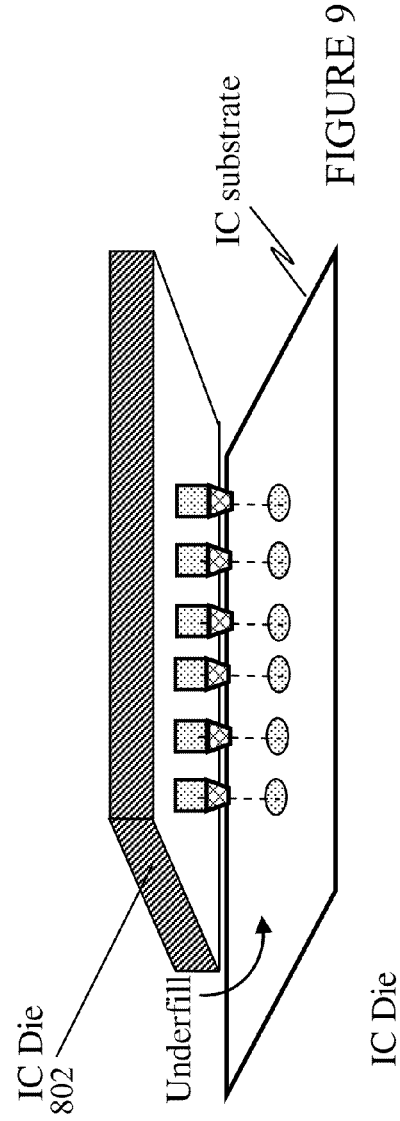
FIGS. 9 and 10 illustrate a new approach by which the IC die is flipped/inverted and mounted it directly onto the packaging substrate (or even a circuit board).
Figure 10:
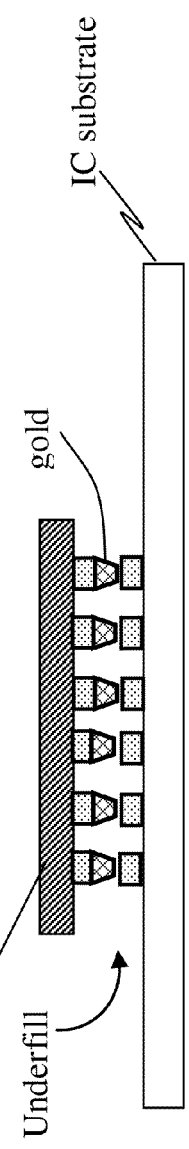

FIGS. 9 and 10 illustrate a new approach by which the IC die is inverted/flipped and mounted it directly onto the packaging substrate (or even a circuit board). However, one difficulty in doing this is that the IC die must remain level while it is being mounted on the substrate. This is accomplished by using underfill of adequate consistency and amount between the substrate and the IC die. The underfill levels the IC die while it is being mounted onto the substrate. The studs or bumps are coupled to the contact pads on the IC die. Then, a thermal or ultrasonic bonding method is used to couple to studs to corresponding pads on the substrate. Note that this technique of adding underfill before the studs are actually coupled to the pads is contrary to conventional approaches as the underfill tends to insert a layer of impurities between the studs and pads.

Concept D—IC Die Stacking Using Through-Silicon Vias (TSV)

IC dies are typically packaged individually by mounting onto a substrate (e.g., FIG. 8) which is then encapsulated. Such packaging increases the overall size of the component. IC dies typically include bond pads along one surface. In conventional implementations, bond pads on an IC die are coupled to these wire bonds which are then coupled to a mounting substrate.

Figure 11:
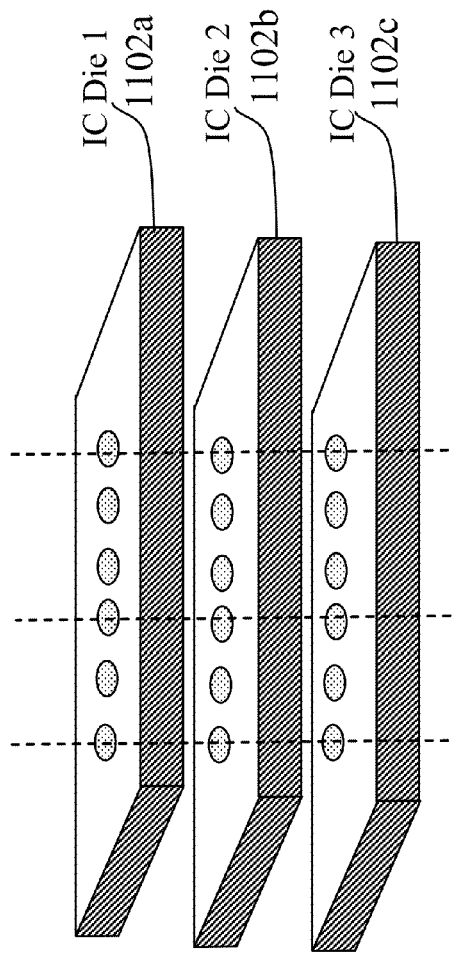
FIGS. 11 and 12 illustrate how a plurality of IC dies may be stacked by using through silicon vias.
Figure 12:
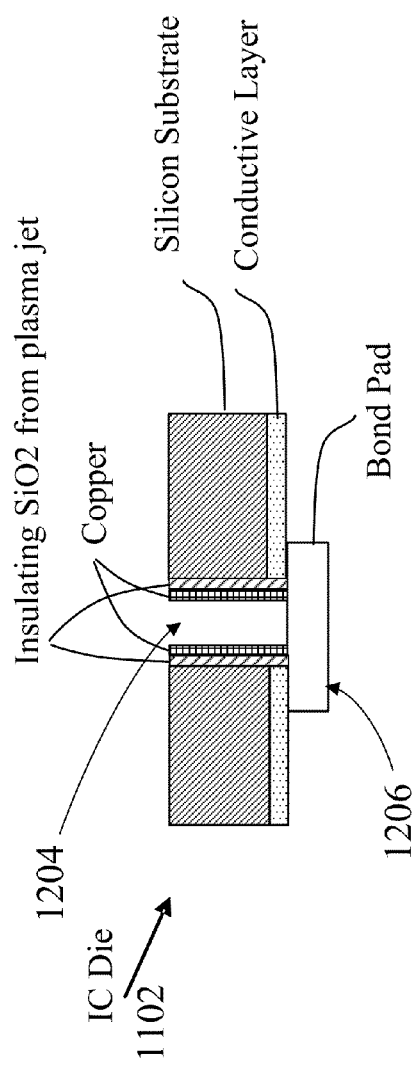

FIGS. 11 and 12 illustrate how a plurality of IC dies 1102a, 1102b, and 1102c may be stacked by using through silicon vias 1204. Because the bond pads 1206 of an IC die 1102 are found on only one surface, through silicon vias (TSV) 1204 are formed from one surface of the ceramic substrate of the IC die to the other surface. These TSV 1204 extend from the bond pads 1206 on a first surface to a second surface of the IC die. Because forming TSVs through IC dies 0.005 to 0.029 inches thick is difficult to do (without damaging the bond pads), a novel feature uses a process based on a plasma jet that can make vias of a desired depth. The plasma jet process causes SiO2 to be deposited on the walls of the vias. The SiO2 allows depositing copper on the walls of the vias which serve as a conductive path to the opposite surface while also electrically insulating the copper vias from the die body. Note that, in order to form the pass through vias 1204, the IC dies 1102 may be designed such that no circuits are formed underneath the pads 1206 so that the vias 1204 may be formed without damaging the IC 1102.

Figure 13:
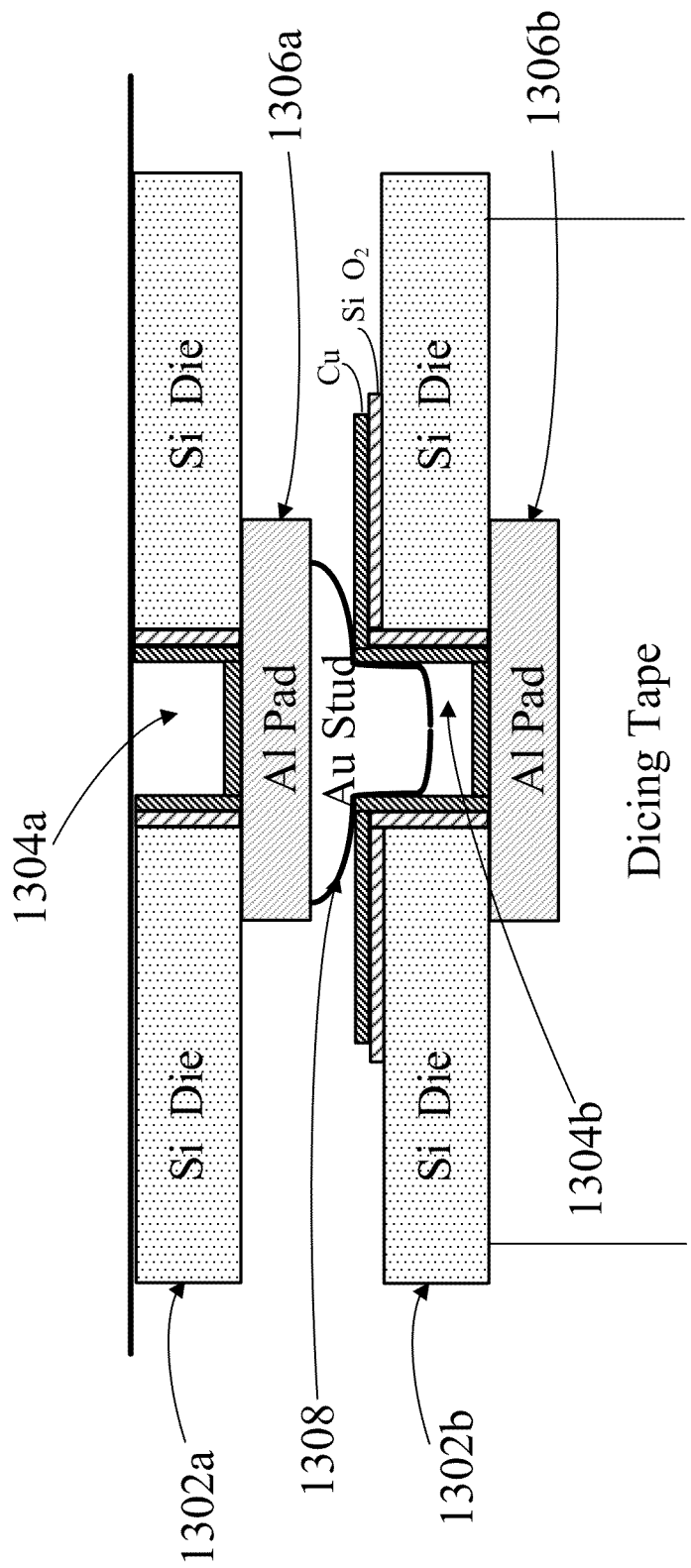
FIG. 13 illustrates one example of how IC dies having through silicon vias may be stacked.

FIG. 13 illustrates one example of how IC dies 1302a and 1302 having through silicon vias 1304a and 1304b may be stacked. In this example, bond pad 1306a on a first die 1302a may have a stud 1308 coupled thereto. The stud 1308 may serve to couple the first via 1304a to the second via 1304b. A plurality of dies with pass-through vias may thus be stacked.

Concept E—BGA Thinning—Stacking of Modified (Ground-Off) IC BGA Packages

FIGS. 14 and 15 illustrate how improved IC densities may be achieved by thinning the IC. In this example, the IC is in a BGA package. In the prior art, IC dies are typically mounted on a BGA packing substrate and packaged. Such packaging is primarily for the protection of the IC die. Consequently, stacks of BGA packages are typically very thick. The invention involves a method for grinding off a large portion of the packaging or protective material, thereby making the IC packages substantially thinner. These thinner BGA packages can then be physically and electrically stacked together. This allows forming a thinner stack of BGA IC devices. This is an unconventional approach since grinding-off an IC package often voids their warranty and risks damaging the IC die.

Figure 16:
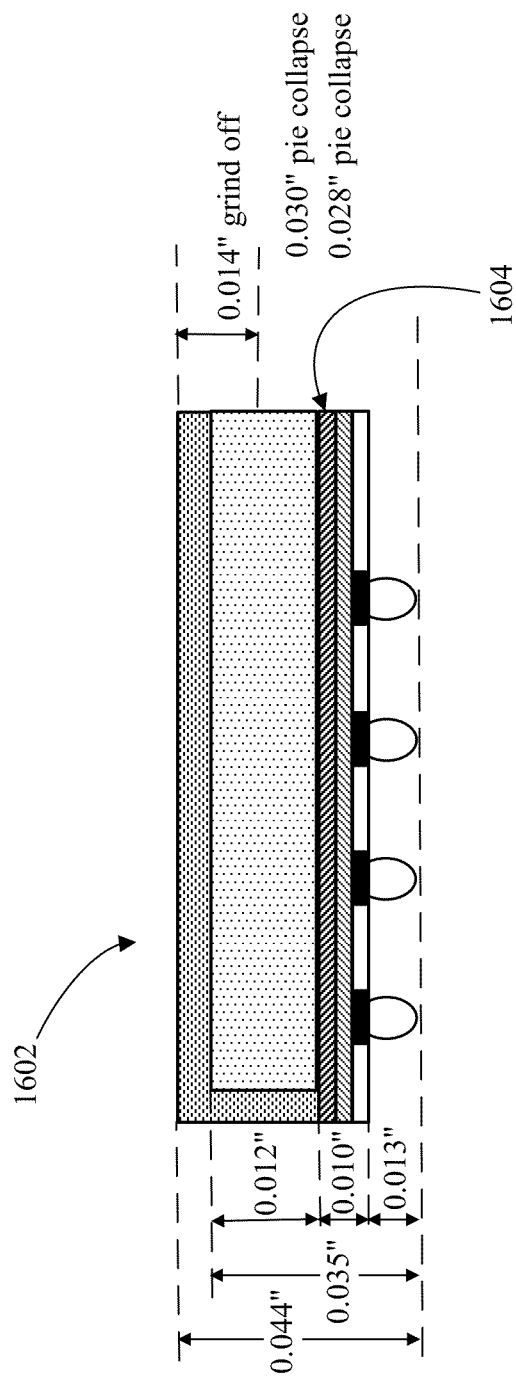
FIG. 16 illustrates a close-up example of how a typical IC package may be thinned.

FIG. 16 illustrates a close-up example of how a typical IC package may be thinned. In this example, the IC die 1602 may have an over all thickness of an IC package (including BGA balls) may be 0.044 inches. At least 0.014 inches of the top of the IC package 1602 may be ground off or otherwise removed without damaging the die region 1604. Therefore, the thickness of the IC package may be reduced by approximately half or more.

Concept F—Memory Module with Heat Dissipation

As more memory devices are added to a memory module (e.g., DIMM) and speeds increase, heat dissipation becomes a consideration. Most prior art memory modules use heat sinks or dissipation shields attached to the plane surfaces of the memory modules (in contact with the memory devices) to dissipate heat away.

Figure 17:
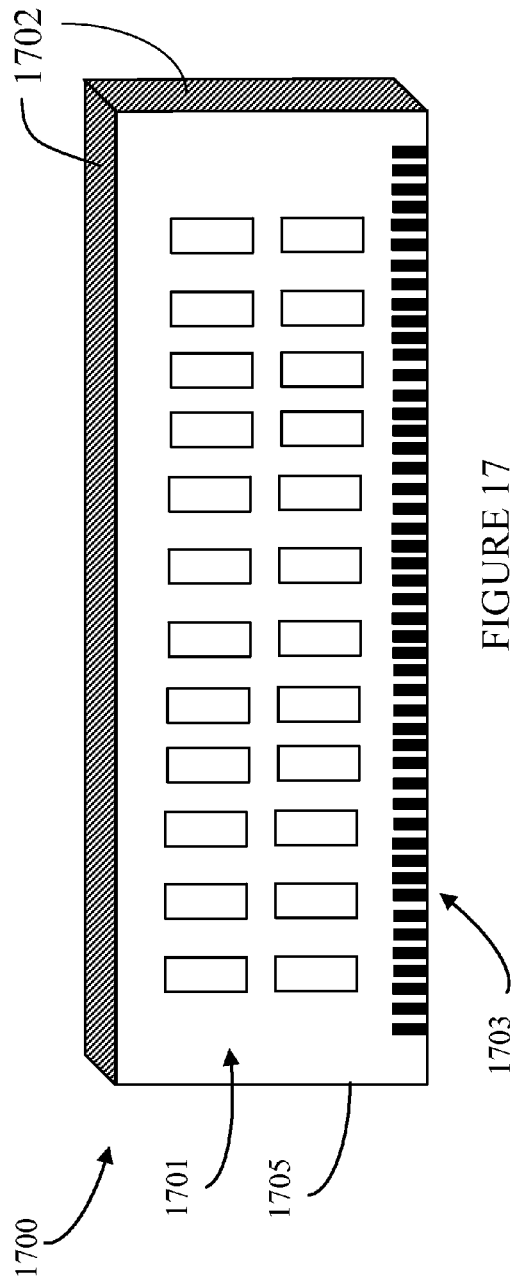
FIGS. 17 and 18 illustrate a memory module with improved heat dissipation.
Figure 18:
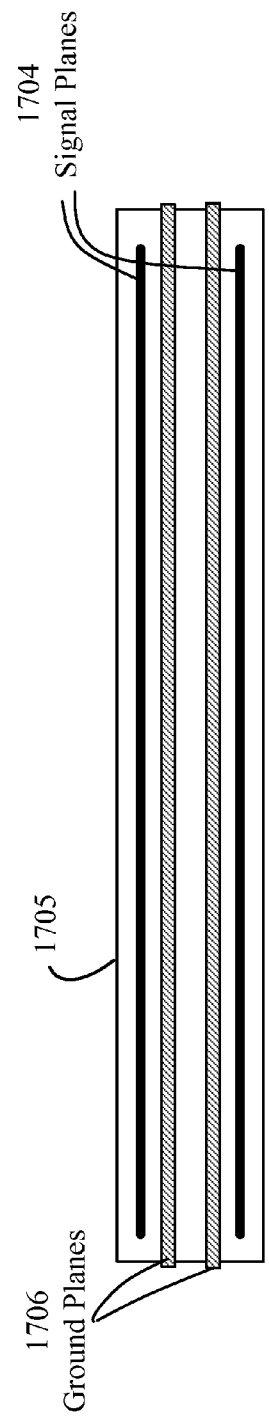

FIGS. 17 and 18 illustrate a memory module 1700 with improved heat dissipation. To better dissipate heat away from the memory module 1700, the present invention exposes the ground planes 1706 of the memory module along the edges, and plates those ends (e.g., sides, bottom, and/or top) with a heat conductive material 1702. Consequently, a heat dissipation surface is formed along the perimeter to transfer heat from the ground planes. The heat reaches the ground planes 1706 from the memory devices through the ground vias with the memory devices. Additionally, the heat conductive material 1702 may be coupled to interconnecting socket which may be specially adapted to act as a heat sink or to transfer heat to a heat sink or mounting substrate. In one example, a memory module 1700 is provided comprising: (a) a substrate 1705 having a plurality of memory devices 1701 on at least one side of the substrate 1705; (b) an interface 1703 along one edge of the substrate 1705; (c) one or more ground planes 1706 embedded within the substrate 1705 and extending to one or more edges of the substrate 1705; (d) one or more signal planes 1704 embedded within the substrate 1705; and (e) an external layer of heat conductive material 1702 along at least three edges of the substrate 1705. The external layer of heat conductive material 1702 is coupled to the ground planes 1706 to transfer heat from the ground planes 1706 and isolated from the signal planes 1704. The memory module 1700 and external layer of heat conductive material 1702 are adapted to carry heat away from the memory module 1700.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. A memory stack, comprising:
a plurality of substrate layers stacked together into a stack, each substrate layer including a substrate having a plurality of cavities to receive integrated circuit components within the thickness of the substrate, each substrate having a first surface configured to couple to a first plurality of integrated circuits received in a corresponding number of cavities and a second surface configured to couple to a second plurality of integrated circuits received in the corresponding number of cavities, wherein the first and second surfaces are on opposing sides of the substrate;
a plurality of conductive spheres arranged between at least two adjacent substrate layers and electrically coupled to the integrated circuit components in at least one of the two adjacent substrates; and
at least two integrated circuit components mounted in each cavity of a substrate layer.

2. The memory stack of claim 1, wherein the plurality of conductive spheres includes
a first plurality of conductive spheres between a first set of adjacent substrates of the stack,
a second plurality of conductive spheres between a second set of adjacent substrates of the stack, wherein the first plurality of conductive spheres is electrically coupled to the second plurality of conductive spheres.

3. The memory stack of claim 1, wherein two adjacent substrate layers of the stack include:
a first substrate having a first plurality of cavities to receive integrated circuit components, and
a second substrate having a second plurality of cavities to receive integrated circuit components, wherein the first plurality of cavities is offset from a second plurality of cavities.

4. The memory stack of claim 1, further comprising the first plurality of integrated circuit components and the second plurality of integrated circuit components, wherein the first and second pluralities of integrated circuit components are stacked as pairs within a corresponding number of the plurality of cavities of the substrate, and coupled to respective first and second surfaces of the substrate.

5. The memory stack of claim 4, wherein adjacent opposing surfaces of the first and second integrated circuits are positioned within the cavity and between the first and second surfaces of the substrate.

6. The memory stack of claim 1, further comprising:
a plurality of passive components received within a subset of the plurality of cavities.

7. The memory stack of claim 4, wherein the first and second integrated circuit components are packaged integrated circuit components, each having connection leads or legs bent for surface mounting the packaged components in a first orientation, wherein the packaged components are mounted on the substrate a second orientation that is inverted with respect to the first orientation.

8. The memory stack of claim 1, wherein the thickness of each substrate is in the range of 40 to 100 mils.

9. The memory stack of claim 1, further comprising:
a cavity within one of the substrates; and
an electronic component within the cavity, wherein the electronic component is thicker than the space between two adjacent substrates.

10. A memory module, comprising:
a substrate having a plurality of memory devices on at least one side of the substrate;
an electrical bus interface along one edge of the substrate;
one or more ground planes embedded within the substrate and extending to one or more edges of the substrate;
one or more signal planes embedded within the substrate; and
an external layer of heat conductive material plated onto at least three edge surfaces of the substrate.

11. The memory module of claim 10, wherein the external layer of heat conductive material is coupled to the ground planes and isolated from the signal planes.

12. The memory module of claim 10, wherein the external layer of heat conductive material transfers heat away from the memory module.

13. The memory module of claim 10, wherein the heat conductive material is metal.

14. The memory module of claim 11, wherein the coupling is an electrical coupling.

* * * * *